(12) United States Patent
Jain et al.

(10) Patent No.: US 10,367,083 B2
(45) Date of Patent: Jul. 30, 2019

(54) COMPACT DEVICE STRUCTURES FOR A BIPOLAR JUNCTION TRANSISTOR

(71) Applicant: GLOBALFOUNDRIES INC., Grand Cayman (KY)

(72) Inventors: Vibhor Jain, Essex Junction, VT (US); Renata Camillo-Castillo, Essex Junction, VT (US); Qizhi Liu, Lexington, MA (US); John J. Pekarik, Underhill, VT (US); Alvin J. Joseph, Williston, VT (US); Peter B. Gray, Jericho, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 60 days.

(21) Appl. No.: 15/081,443

(22) Filed: Mar. 25, 2016

(65) Prior Publication Data

US 2017/0278955 A1     Sep. 28, 2017

(51) Int. Cl.

| | |
|---|---|
| *H01L 29/732* | (2006.01) |
| *H01L 29/06* | (2006.01) |
| *H01L 29/10* | (2006.01) |
| *H01L 29/08* | (2006.01) |
| *H01L 29/417* | (2006.01) |
| *H01L 21/762* | (2006.01) |
| *H01L 29/73* | (2006.01) |

(52) U.S. Cl.
CPC ...... *H01L 29/732* (2013.01); *H01L 21/76224* (2013.01); *H01L 29/0649* (2013.01); *H01L 29/0804* (2013.01); *H01L 29/0821* (2013.01); *H01L 29/1004* (2013.01); *H01L 29/41708* (2013.01); *H01L 29/73* (2013.01)

(58) Field of Classification Search
CPC ............... H01L 29/732; H01L 29/0804; H01L 29/1004; H01L 21/76224; H01L 21/763; H01L 29/73; H01L 29/1009
See application file for complete search history.

(56) References Cited

U.S. PATENT DOCUMENTS

| | | | | |
|---|---|---|---|---|
| 4,452,645 A | * | 6/1984 | Chu ...................... | H01L 21/265 148/DIG. 117 |
| 5,109,263 A | * | 4/1992 | Nanba ............... | H01L 21/76229 257/583 |
| 6,482,710 B2 | * | 11/2002 | Oda .................. | H01L 29/66242 257/581 |

(Continued)

*Primary Examiner* — Tuan A Hoang
(74) *Attorney, Agent, or Firm* — Thompson Hine LLP; Anthony Canale

(57) ABSTRACT

Device structures for a bipolar junction transistor and methods for fabricating a device structure using a substrate. One or more primary trench isolation regions are formed that surround an active device region of the substrate and a collector contact region of the substrate. A base layer is formed on the active device region and the collector contact region, and the active device region includes a collector. Each primary trench isolation region extends vertically to a first depth into the substrate. A trench is formed laterally located between the base layer and the collector contact region and that extends vertically through the base layer and into the substrate to a second depth that is less than the first depth. A dielectric is formed in the trench to form a secondary trench isolation region. An emitter is formed on the base layer.

12 Claims, 6 Drawing Sheets

(56) References Cited

U.S. PATENT DOCUMENTS

| | | | |
|---|---|---|---|
| 7,071,500 B2* | 7/2006 | Miura | H01L 29/0821 |
| | | | 257/197 |
| 7,190,046 B2* | 3/2007 | Akatsu | H01L 29/0692 |
| | | | 257/522 |
| 7,202,514 B2 | 4/2007 | Ahmed et al. | |
| 7,880,270 B2 | 2/2011 | Heinemann et al. | |
| 7,888,745 B2* | 2/2011 | Khater | H01L 29/7378 |
| | | | 257/370 |
| 8,492,794 B2* | 7/2013 | Cai | H01L 29/737 |
| | | | 257/197 |
| 8,927,381 B2* | 1/2015 | Harame | H01L 29/66234 |
| | | | 257/565 |
| 9,093,491 B2 | 7/2015 | Adkisson et al. | |
| 2002/0053705 A1* | 5/2002 | Kondo | H01L 21/8249 |
| | | | 257/368 |
| 2012/0139009 A1* | 6/2012 | Ning | H01L 29/0808 |
| | | | 257/197 |
| 2015/0060950 A1* | 3/2015 | Camillo-Castillo | |
| | | | H01L 29/0653 |
| | | | 257/197 |

* cited by examiner

US 10,367,083 B2

COMPACT DEVICE STRUCTURES FOR A BIPOLAR JUNCTION TRANSISTOR

BACKGROUND

The invention relates generally to semiconductor device fabrication and, in particular, to bipolar junction transistors and fabrication methods for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits.

A bipolar junction transistor is a three-terminal electronic device that includes an emitter, an intrinsic base, and a collector defined by regions of different semiconductor materials. A heterojunction bipolar transistor is a variant of a bipolar junction transistor in which at least two of the collector, emitter, and intrinsic base are composed of semiconductor materials with different energy bandgaps. In the device structure, the intrinsic base is situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased, the base-collector junction is reverse biased, and the collector-emitter current may be controlled by the base-emitter voltage.

Device structures and fabrication methods are needed that improve the performance and/or compactness of a bipolar junction transistor.

SUMMARY

In an embodiment of the invention, a method is provided for making a device structure using a substrate. One or more primary trench isolation regions are formed that surround an active device region of the substrate and a collector contact region of the substrate. A base layer is formed on the active device region and the collector contact region, and the active device region includes a collector. Each primary trench isolation region extends vertically to a first depth into the substrate. A trench is formed laterally located between the base layer and the collector contact region and that extends vertically through the base layer and into the substrate to a second depth that is less than the first depth. A dielectric is formed in the trench to form a secondary trench isolation region. An emitter is formed on the base layer.

In an embodiment of the invention, a device structure is formed using a substrate. The device region includes one or more primary trench isolation regions surrounding an active device region of the substrate and a collector contact region of the substrate. Each primary trench isolation region extends vertically to a first depth into the substrate. The active device region includes a collector. A base layer is located on the active device region and an emitter is located on the base layer. A secondary trench isolation region extends vertically through the base layer and into the substrate to a second depth that is less than the first depth. The secondary trench isolation region is laterally located between the base layer and the collector contact region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
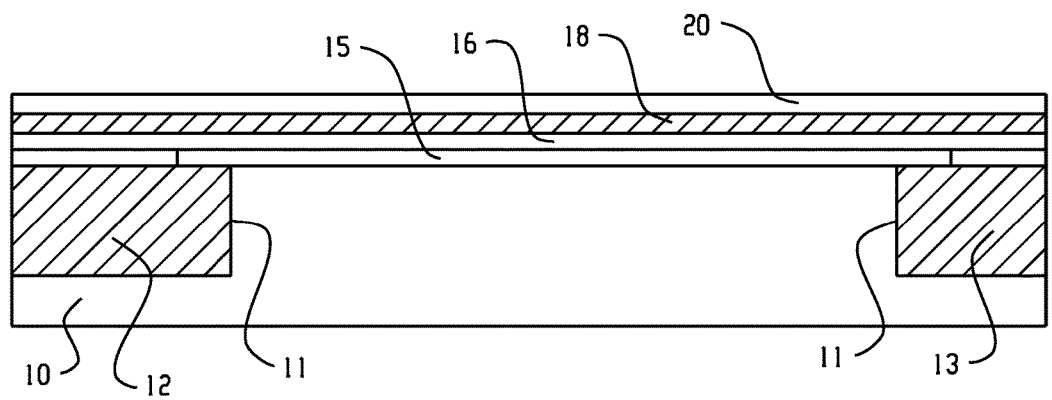
FIGS. 1-5 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. The semiconductor material constituting the substrate 10 may include an epitaxial layer at its surface, which may contain an electrically-active dopant that alters its electrical properties. For example, the substrate 10 may include a layer of single crystal silicon at its top surface that may be doped during growth or by implantation with an n-type dopant from Group V of the Periodic Table (e.g., phosphorus (P), arsenic (As), or antimony (Sb)) in a concentration that is effective to impart n-type conductivity.

One or more trench isolation regions 12, 13, also referred to as primary trench isolation regions 12, 13, are formed in the substrate 10. The trench isolation regions 12, 13 may be formed by a shallow trench isolation (STI) technique that relies on a lithography and dry etching process to define trenches in substrate 10, deposits an electrical insulator to fill the trenches, and planarizes the electrical insulator relative to the top surface of the substrate 10 using a chemical mechanical polishing (CMP) process. The electrical insulator may be comprised of an oxide of silicon, such as silicon dioxide deposited by chemical vapor deposition.

A collector pedestal 15 is formed on a top surface of a portion of the substrate 10 between the trench isolation regions 12, 13. The collector pedestal 15 may be comprised of a semiconductor material (e.g., silicon) having the same conductivity type as the substrate 10, and may extend laterally over a top surface of the trench isolation regions 12, 13. The collector pedestal 15 may be formed by a lateral epitaxial formation process such that the collector pedestal 15 has an epitaxial relationship with the substrate 10. The semiconductor material constituting the collector pedestal 15 will acquire the crystal orientation and crystal structure of single crystal semiconductor material of the substrate 10, which serves as a template for the formation of the collector pedestal 15. Additional sections of polycrystalline semiconductor material may be deposited on trench isolation regions 12, 13 peripheral to the collector pedestal 15 when the semiconductor material forming collector pedestal 15 is grown.

A base layer 16 is formed as an additive layer on the top surface of the collector pedestal 15 and the sections of polycrystalline semiconductor on the trench isolation regions 12, 13. The base layer 16 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the base layer 16 may be graded and/or stepped across the thickness of base layer 16. If the germanium content is stepped, thicknesses of the base layer 16, such as respective thicknesses at its top and bottom surfaces, may lack any germanium content and may instead be entirely comprised of silicon. The base layer 16 may be doped with one or more impurity species, such as a dopant like boron (B) and optionally carbon (C).

The base layer 16 may be formed using a low temperature epitaxial (LTE) growth process, such as vapor phase epitaxy (VPE) conducted at a growth temperature ranging from 400° C. to 850° C., that forms single crystal semiconductor material (e.g., single crystal silicon and/or single crystal silicon-germanium) on the collector pedestal 15. Epitaxial growth is a process by which the single-crystal semiconductor material of the base layer 16 is grown or deposited on the single-crystal semiconductor material of the collector pedestal 15 and in which the crystallographic structure of the single-crystal material of the collector pedestal 15 is reproduced in the semiconductor material of the base layer 16. During epitaxial growth, the semiconductor material constituting the base layer 16 will acquire the crystal orientation and crystal structure of single crystal semiconductor material of the collector pedestal 15, which serves as a template for growth of the base layer 16 and has the crystal orientation and crystal structure of the substrate 10.

A base dielectric layer 18 is formed on a top surface of base layer 16. The base dielectric layer 18 may be comprised of an electrical insulator with a dielectric constant (e.g., a permittivity) characteristic of a dielectric material. In one embodiment, the base dielectric layer 18 may be comprised of a high temperature oxide (e.g., silicon dioxide) deposited using a rapid thermal process (RTP) at a temperature of 500° C. or higher.

A sacrificial layer 20 comprised of, for example, a semiconductor material is formed on the top surface of the base dielectric layer 18. For example, the sacrificial layer 20 may be comprised of polycrystalline silicon (i.e., polysilicon) deposited by chemical vapor deposition.

Figure 2:
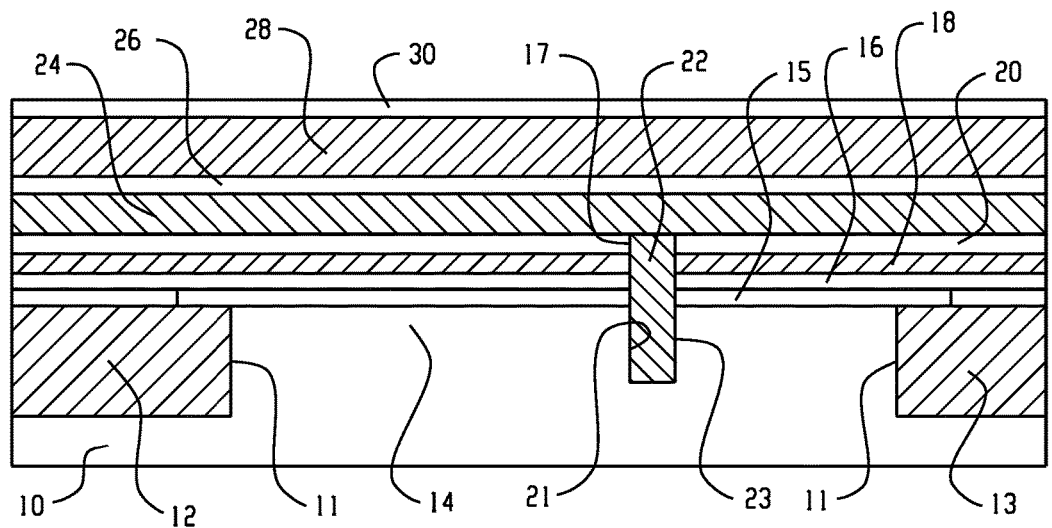

With reference to FIG. 2 in which like reference numerals refer to like features in FIG. 1 and at a subsequent fabrication stage of the processing method, a secondary trench isolation region 22 is formed in a trench 23 that extends vertically through layers 16, 18, 20 and the collector pedestal 15 to a shallow depth in the substrate 10. An active device region 14 may be defined between the trench isolation region 12 and the secondary trench isolation region 22. The trench isolation regions 12, 22 define the size and placement of the active device region 14.

The secondary trench isolation region 22 and its trench 23 are laterally located between the trench isolation regions 12, 13 and are laterally offset from a centerline of the active device region 14 toward the trench isolation region 13. The secondary trench isolation region 22 and trench 23 extend vertically to a shallower depth in the substrate 10 than the trench isolation regions 12, 13. The trench 23 terminates at opposite ends along its longitudinal axis inside a boundary established by the interior walls 11 of the trench isolation regions 12, 13, as best apparent in FIG. 5A.

The secondary trench isolation region 22 may be formed by patterning an etch mask, etching the trench 23 with the etch mask in place, depositing an electrical insulator to fill the trench 23, and planarizing the electrical insulator relative to the top surface of the sacrificial layer 20 using a chemical mechanical polishing process. The etch mask may be comprised of a layer of an organic photoresist be applied by a spin coating process, pre-baked, exposed to light projected through a photomask, baked after exposure, and developed with a chemical developer. The etch mask includes an opening at an intended location for the trench. The etching process may be conducted in a single etching step or multiple steps, may rely on one or more etch chemistries, and may comprise one or more discrete timed or end-pointed etches. The electrical insulator may be comprised of an oxide of silicon, such as silicon dioxide, deposited by chemical vapor deposition.

The location of the trench 23 for the secondary trench isolation region 22 defines an edge 17 of the base layer 16 at which the base layer 16 terminates. At the location of the edge 17, a sidewall 21 of the secondary trench isolation region 22 and its trench 23 are coextensive with the edge 17 at the side of the base layer 16. The edge 17 of the base layer 16 extends lengthwise along the long axis of the secondary trench isolation region 22 and its trench 23. A top surface of the secondary trench isolation region 22 projects above the top surface of the base layer 16, as well as above the top surface of the base dielectric layer 18 on the base layer 16. No portion of the secondary trench isolation region 22 is vertically located beneath the base layer 16; instead, the secondary trench isolation region 22 is laterally located relative to the edge 17 to the side of the base layer 16. In particular, this juxtaposed relationship is present at the edge 17 in a plane of the base layer 16 that is orthogonal to a plane containing the sidewall 21 of the secondary trench isolation region 22 and its trench 23.

An extrinsic base layer 24 is formed on the top surface of the sacrificial layer 20. In one embodiment, the extrinsic base layer 24 may be comprised of amorphous semiconductor material or polycrystalline semiconductor material (e.g., polysilicon or polycrystalline SiGe) deposited by chemical vapor deposition. If the extrinsic base layer 24 is comprised of silicon-germanium, the concentration of germanium may have a graded or an abrupt profile and may include additional layers, such as a silicon cap. The extrinsic base layer 24 may be in situ doped during deposition with a concentration of a dopant, such as an impurity species from Group III of the Periodic Table (e.g., boron) effective to impart p-type conductivity.

Dielectric layers 26, 28, 30 are serially formed as a stack on the extrinsic base layer 24. Dielectric layer 26 is formed on a top surface of extrinsic base layer 24, dielectric layer 28 is formed on a top surface of dielectric layer 26, and dielectric layer 30 is formed on a top surface of dielectric layer 28. Dielectric layers 26, 30 may be comprised of the same electrical insulator, such as an oxide of silicon (e.g., silicon dioxide) deposited by chemical vapor deposition. Dielectric layer 28 may be comprised of an electrical insulator with a different etch selectivity than dielectric layers 26, 30. In one embodiment in which the dielectric layers 26, 30 are comprised of silicon dioxide, the dielectric layer 28 may be comprised of silicon nitride ($Si_3N_4$) deposited using chemical vapor deposition.

Figure 3:
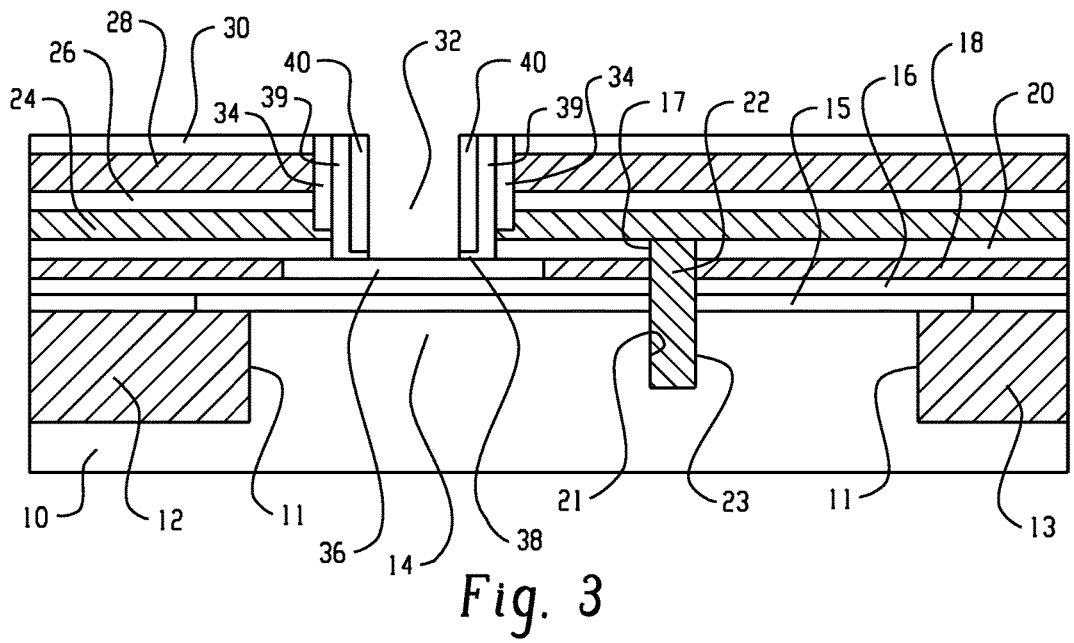

With reference to FIG. 3 in which like reference numerals refer to like features in FIG. 2 and at a subsequent fabrication stage of the processing method, dielectric layers 26, 28, 30 are patterned using photolithography and etching processes to define an emitter opening 32 aligned with a portion of the collector pedestal 15 located on the active device region 14 between trench isolation region 12 and secondary trench isolation region 22. The emitter opening 32 is extended by an etching process, such as reactive ion etching, partially through the extrinsic base layer 24. Spacers 34 are formed on the vertical sidewalls of the emitter opening 32. The emitter opening 32, after being narrowed by the formation of the spacers 34, is extended completely through the extrinsic base layer 24 using an etching process, such as reactive ion etching, that stops on the base dielectric layer 18.

The emitter opening 32 is extended in depth through the base dielectric layer 18 by a wet chemical etching process that stops on the base layer 16. The wet chemical etching process may use either dilute hydrofluoric (DHF) or buffered hydrofluoric (BHF) as an etchant if the base dielectric layer 18 is comprised of silicon dioxide. The wet chemical etching process may remove dielectric layer 30 as shown in the representative embodiment. The etching process may cause the base dielectric layer 18 to laterally recess beneath the spacers 34 and thereby form a cavity between the base layer 16 and the overlying sacrificial layer 20 and extrinsic base layer 24. A link layer 36 is formed on the top surface of base layer 16 inside the emitter opening 32. The link layer 36 may be comprised of semiconductor material deposited by an epitaxial growth process and may be formed using a selective epitaxial growth process in which the semiconductor material does not nucleate for epitaxial growth from insulator surfaces. At its edges, the link layer 36 fills the cavity between the collector pedestal 15 and the overlying sacrificial layer 20 and extrinsic base layer 24, and electrically and physically couples the extrinsic base layer 24 with the base layer 16.

After the link layer 36 is formed, a pad layer 38 and spacers 39, 40 are formed inside the emitter opening 32. The pad layer 38 and spacers 39 may be formed from a dielectric material that is electrically insulating, such as a thin layer of silicon dioxide. Spacers 40 may be formed from a thin layer of a different dielectric material, such as silicon nitride. After the spacers 39, 40 are formed, the emitter opening 32, which is narrowed by the spacers 39, 40, is extended through the pad layer 38 to the top surface of the link layer 36 on base layer 16.

Figure 4:
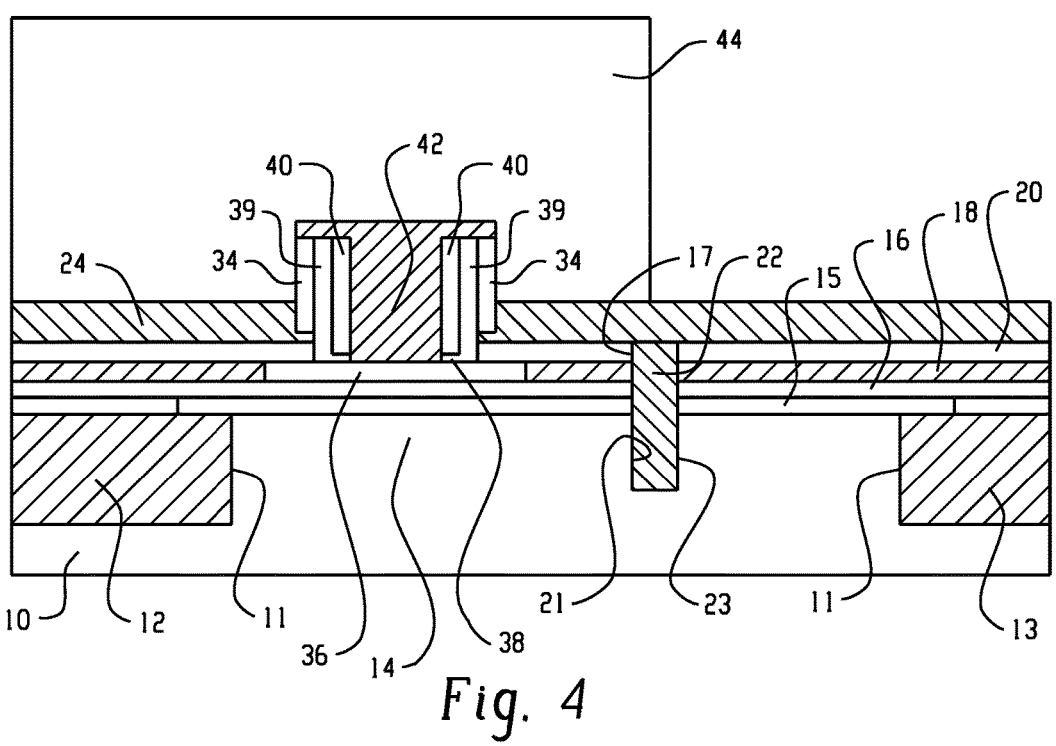

With reference to FIG. 4 in which like reference numerals refer to like features in FIG. 3 and at a subsequent fabrication stage of the processing method, an emitter finger 42 is formed in the emitter opening 32. The non-conductive spacers 39, 40 surround and electrically isolate the emitter finger 42 from the extrinsic base layer 24. The emitter finger 42 indirectly contacts the base layer 16 because of the intervening link layer 36. The emitter finger 42 of may be formed from a layer of a heavily-doped semiconductor material, such as polysilicon heavily doped with a concentration of a dopant from Group V of the Periodic Table (e.g., phosphorus (P) or arsenic (As)) to impart n-type conductivity, that is deposited (e.g., by chemical vapor deposition) and then patterned using lithography and etching processes. Due to overgrowth during deposition, the head of the emitter finger 42 may protrude from the mouth of the emitter opening 32 and may include lateral arms that overlap with the spacers 34, 39, 40.

Dielectric layers 26, 28 may be patterned using the same etch mask used to form the emitter finger 42 and an etching process, such as reactive ion etching, with suitable etch chemistries. A dielectric cap may be optionally formed on the head of the emitter finger 42 to protect the emitter finger 42 during etching. The emitter finger 42 is laterally located between the secondary trench isolation region 22 and the primary trench isolation region 12 in a direction orthogonal to a longitudinal axis of the emitter finger 42.

A patterned etch mask 44 is applied that covers the emitter finger 42 and the extrinsic base layer 24 adjacent to the emitter finger 42, but exposes the extrinsic base layer 24 in a field region between the trench isolation region 13 and the secondary trench isolation region 22. The etch mask 44 may be comprised of a layer of an organic photoresist applied by a spin coating process, pre-baked, exposed to light projected through a photomask, baked after exposure, and developed with a chemical developer.

Figure 5:
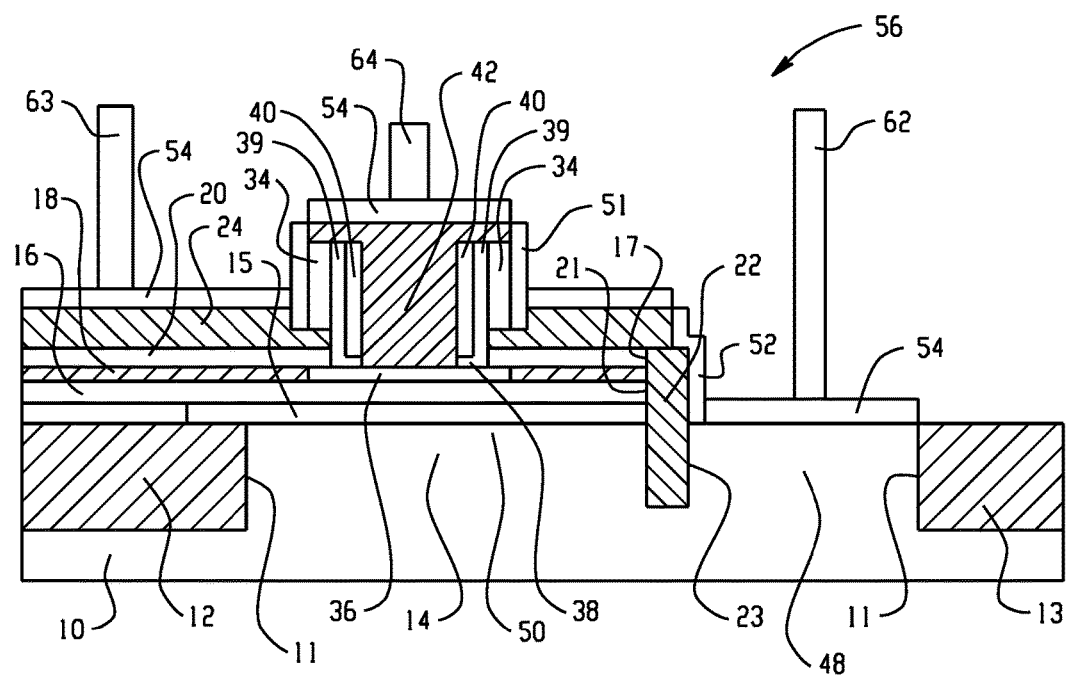
Figure 5A:
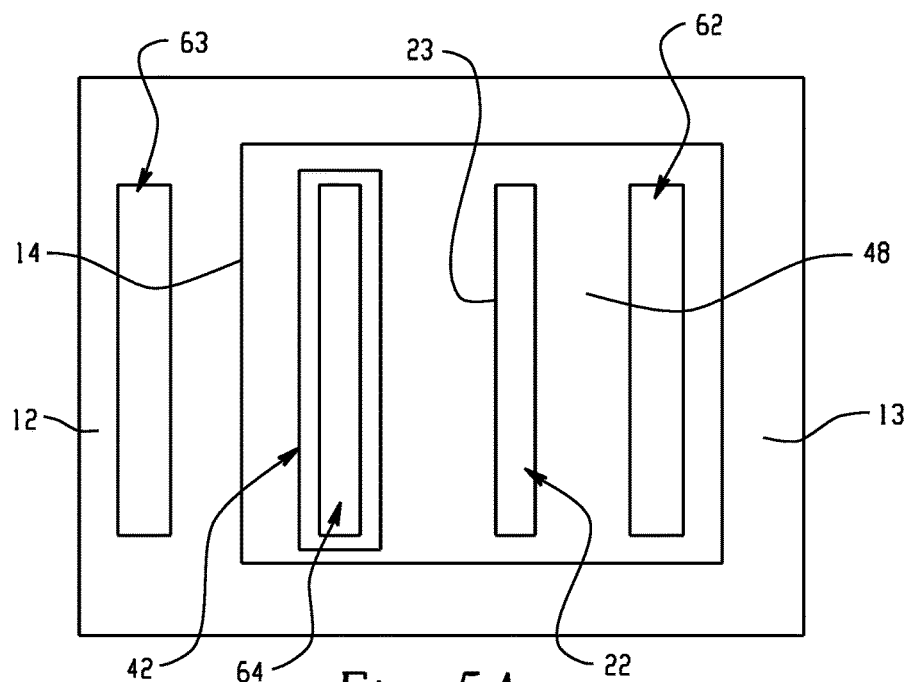
FIG. 5A is a diagrammatic top view of the device construction of FIG. 5 in which the contacts, emitter, and trench isolation regions are shown to illustrate the arrangement of structural elements in the device structure.

With reference to FIGS. 5, 5A in which like reference numerals refer to like features in FIG. 4 and at a subsequent fabrication stage of the processing method, the layers 16, 18, 20, 24 may be removed in the field region and in the presence of the patterned etch mask 44 by a dry etching process (e.g., reactive-ion etching (RIE)), a wet chemical etching process, or a combination of wet and dry etching processes conducted in one or more steps using one or more etch chemistries. The top surface of the active device region 14 between the trench isolation region 13 and the secondary trench isolation region 22 provides a collector contact region 48 that may be used to contact a collector 50 forming all or part of the active device region 14. The dopant concentration of the collector contact region 48 may be elevated to enhance its electrical conductivity by ion implantation. The collector contact region 48 is positioned adjacent to the collector 50 and is laterally separated from the active device region 14 by the secondary trench isolation region 22. The secondary trench isolation region 22 is also laterally positioned between the collector contact region 48 and the edge 17 of the base layer 16 and its trench 23.

Spacers 51, 52 may be formed from a dielectric layer comprised of an electrical insulator, such as silicon nitride, deposited by chemical vapor deposition and etched by an etching process, such as reactive ion etching. Spacer 52 overlaps with the exposed side edge of the secondary trench isolation region 22.

A silicide layer 54 is formed on the top surface of the emitter finger 42, the top surface of the extrinsic base layer 24 adjacent to the emitter finger 42, and the top surface of the collector contact region 48. The spacer 52 and the secondary trench isolation region 22 may electrically and physically isolate the portion of the silicide layer 54 on the collector contact region 48 from the extrinsic base layer 24.

The resulting device structure 56 is a bipolar junction transistor that has a vertical architecture in which the base layer 16 is located between the emitter finger 42 and the collector 50, and the emitter finger 42, the base layer 16, and the collector 50 are vertically arranged. One p-n junction is defined at the interface between the emitter finger 42 serving as the emitter of the device structure 56 and the base layer 16. Another p-n junction is defined at the interface between the collector 50 and the base layer 16. The device structure 56 may be a heterojunction bipolar transistor in which the semiconductor material of the base layer 16 has a value of energy bandgap that differs from the value of the energy bandgap of the semiconductor materials of the emitter finger 42 and collector 50. In one embodiment, the emitter finger 42 and collector 50 may be comprised of silicon and the base layer 16 may be comprised of silicon-germanium, which has a narrower energy bandgap than silicon. The device structure 56 may comprise either an NPN device or a PNP device contingent upon the conductivity types of the emitter finger 42, base layer 16, and collector 50.

In an embodiment, the device structure 56 may be a bipolar junction transistor or heterojunction bipolar transistor that includes only the single emitter finger 42 functioning as the emitter of the device structure 56. In an alternative embodiment, the device structure 56 may be modified to include multiple emitter fingers.

The collector 50 may comprise a selectively implanted collector (SIC) formed by ion implantation in the central part of the active device region 14 at an appropriate stage of the process flow, such as after the emitter opening 32 is formed. The optional SIC implant may be used to adjust the device breakdown voltage, and may be used in conjunction with an implantation mask to selectively produce device structures 56 characterized by different breakdown voltages.

Middle-of-line (MOL) processing follows to form a local interconnect level that includes a dielectric layer (not shown), contacts 62, 63, 64, and wiring (not shown). One or more contacts 62 are coupled with the collector contact region 48, and are laterally located inside the trench isolation regions 12, 13. One or more contacts 63 are coupled with a portion of the extrinsic base layer 24 operating as a base contact region, and are located above the trench isolation region 12, which is outside of the boundary established in part by the interior wall 11 of the trench isolation regions 12. One or more contacts 64 are also coupled with the emitter finger 42. The dielectric layer may be composed of silicon dioxide, silicon nitride, fluorine-doped silicon glass (FSG), borophosphosilicate glass (BPSG), and combinations of these and other dielectric materials. The contacts 62, 63, 64 may be composed of a metal, such as tungsten (W), that is deposited as a layer by, for example, physical vapor deposition (PVD) to fill contact holes and then planarized with, for example, chemical mechanical polishing to remove excess metal from the top surface of the dielectric layer.

Back-end-of-line (BEOL) processing follows, which includes formation of additional dielectric layers, via plugs, and wiring for an interconnect structure coupled by the local interconnect structure with the device structure 56, as well as other similar contacts for additional device structures like device structure 56 and complementary metal-oxide-semiconductor (CMOS) field-effect transistors that may be included in other circuitry fabricated on the substrate 10. As a result, both bipolar junction transistors and CMOS field-effect transistors may be available on the same substrate 10 as circuitry of a BiCMOS integrated circuit.

Several of the processes forming the CMOS field-effect transistors and the device structure 56 for bipolar junction transistors may be shared. For example, the process forming the spacers 46, 47 may be the same process used to form the spacers on the gate structures of the CMOS field-effect transistors. As another example, the process used to reduce the resistivity of the collector contact region 48 may be the same process used to reduce the resistivity of the sources and drains of the CMOS field-effect transistors. As another example, the resistivity of the portion of the active device region 14 forming the collector 50 may be reduced by the same process used to form an n-well used to fabricate the CMOS field-effect transistors.

Figure 6:
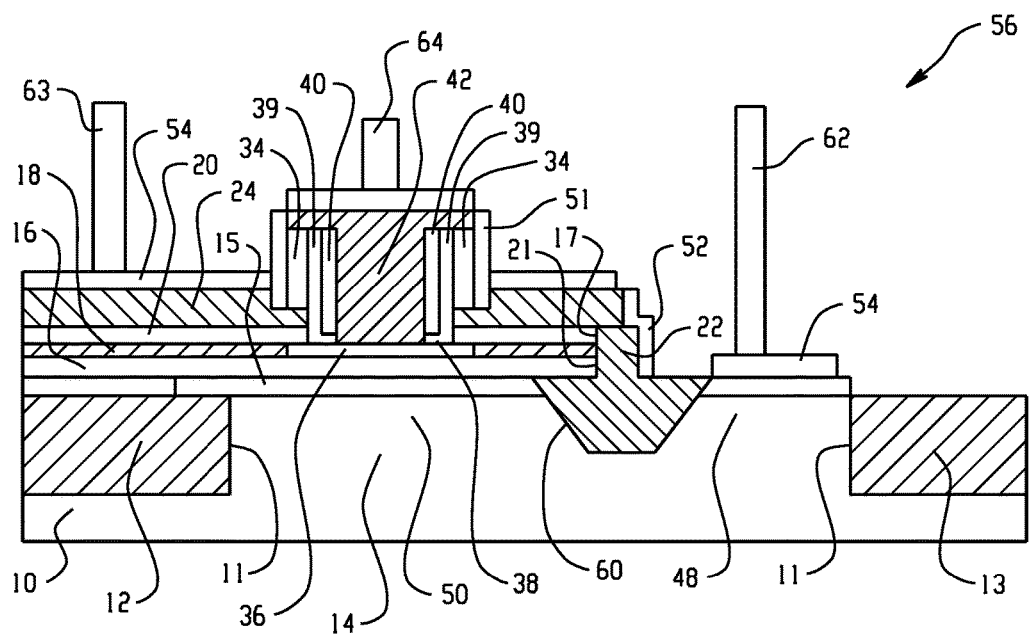
FIGS. 6-9 are cross-sectional views each similar to FIG. 5 of device structures in accordance with alternative embodiments of the invention.

With reference to FIG. 6 in which like reference numerals refer to like features in FIG. 5 and in accordance with an alternative embodiment, the secondary trench isolation region 22 may be formed in a trench 60 having a different shape, such as inclined sidewalls instead of vertical sidewalls. The dielectric material deposited to form the secondary trench isolation region 22 conforms to the different shape of the trench 60. For example, the trench 60 used to form the secondary trench isolation region 22 may include inclined sidewalls that undercut a portion of the base layer 16. This portion of the secondary trench isolation region 22 may function to reduce the parasitic capacitance of the device structure 56 when powered during operation.

To form the trench 60 for the secondary trench isolation region 22, the semiconductor material of the substrate 10 may be etched by a wet chemical etching process, a dry etching process, or a combination of wet chemical and dry etching processes, and the profile of the trench may be adjusted to have a specific shape, undercutting angle, undercut distance (i.e., bias), etc. by selecting factors such as the chemistry, duration, etc. of the etching process. The etching process(es) may be combined with implantation damage to the semiconductor material and/or doping of the semiconductor material to alter etch rates and, thereby, the trench profile. The etching process(es) may further rely on wafer orientation and anisotropic etching processes that exhibit different etch rates for different crystallographic directions (as specified by, for example, Miller indices) in a single-crystal semiconductor material to tailor the profile of the trench 60. The etching process(es) may start with the etching process used to form the trench 23 and then alter the vertical sidewall 21 with an additional etching process to form the inclined sidewalls of trench 60.

Figure 7:
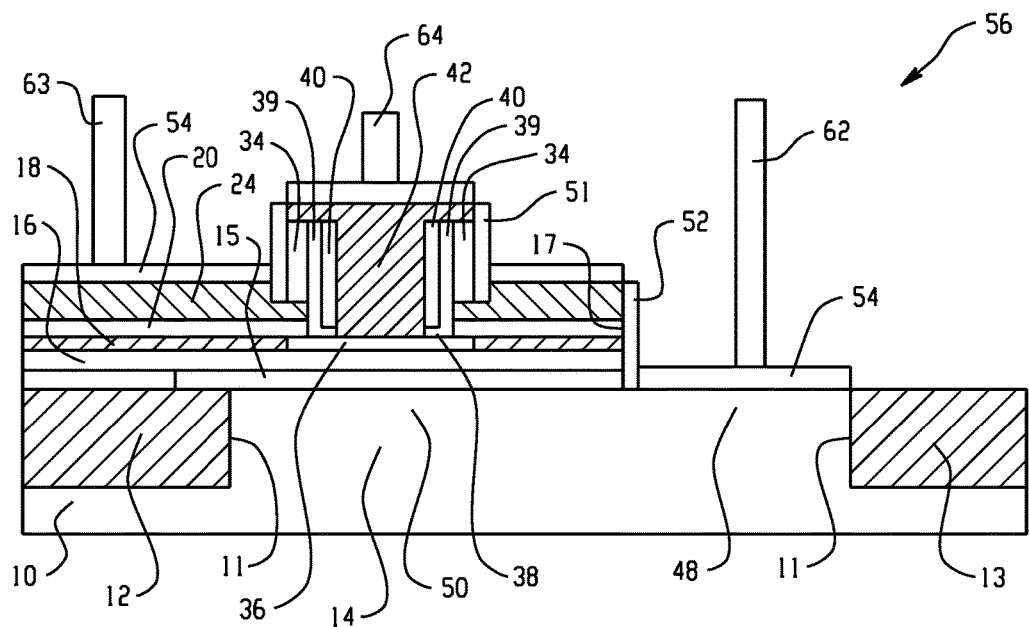

With reference to FIG. 7 in which like reference numerals refer to like features in FIG. 5 and in accordance with an alternative embodiment, the device structure may be modified to omit the secondary trench isolation region 22. The spacer 52 separates the portion of the silicide layer 54 on the collector contact region 48 from the base layer 16, which prevents the development of an electrical short between the collector contact region 48 from the base layer 16. The collector contact region 48 and the collector 50 are continuous due to the omission of the secondary trench isolation region 22.

Figure 8:
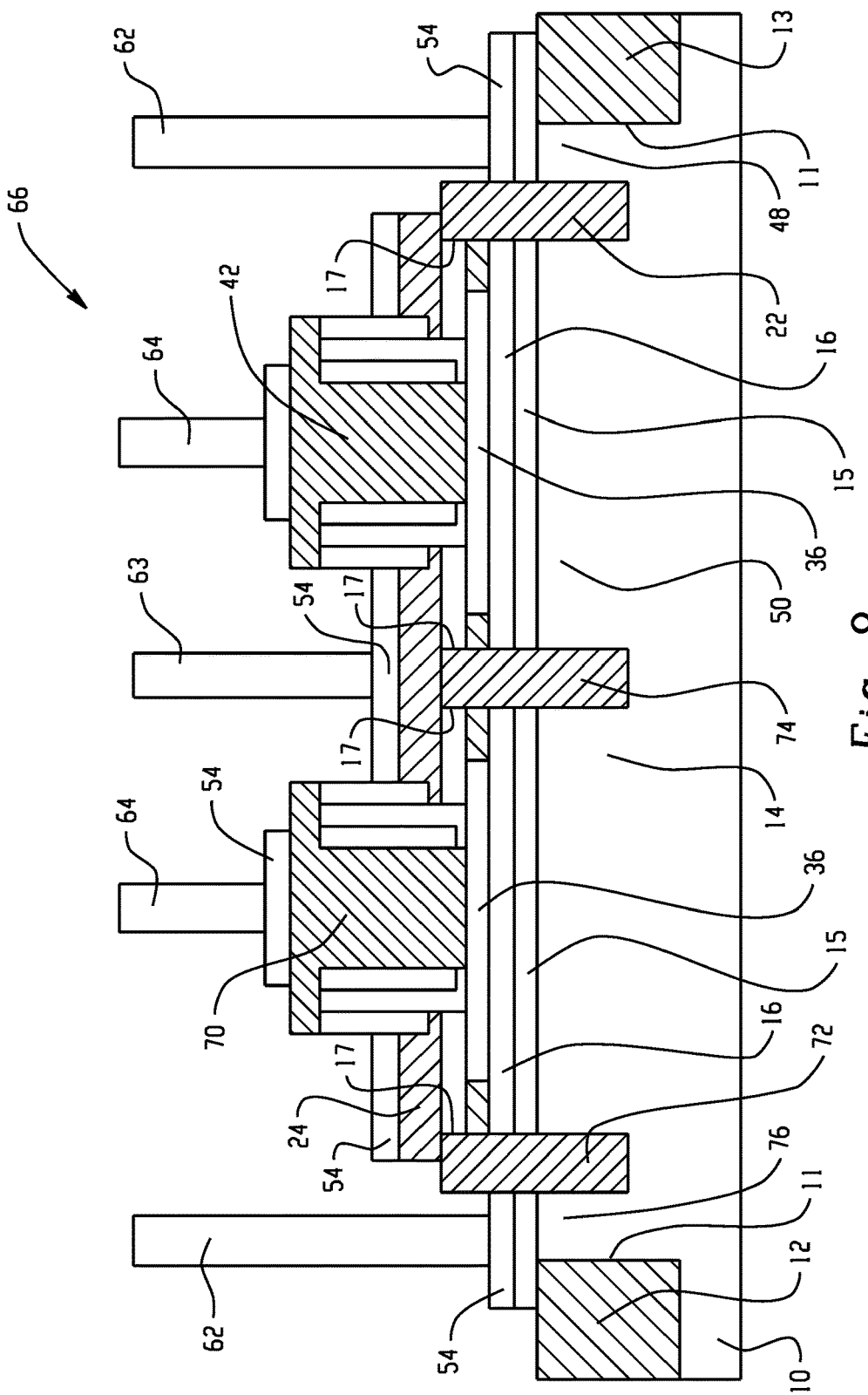

With reference to FIG. 8 in which like reference numerals refer to like features in FIG. 5 and in accordance with an alternative embodiment, a device structure 66 may be provided by modifying the device structure 56 to include one or more additional emitter fingers 70 in addition to the emitter finger 42 such that the device structure 66 includes an emitter comprised of multiple emitter fingers 42, 70. The emitter finger 70 is formed in the same matter as the emitter finger 42 but in a different emitter opening, and has a parallel arrangement with emitter finger 42. Each of the emitter fingers 42, 70 is associated with a different section of the base layer 16.

A secondary trench isolation region 72 similar to the secondary trench isolation region 22 is provided in a trench and isolates another collector contact region 76 from the active device region 14. A secondary trench isolation region 74 is also provided in a trench at a location laterally between the emitter fingers 42, 70 and between the secondary trench isolation regions 22, 72. The respective longitudinal axes of the trenches for the trench isolation regions 22, 72, 74 are aligned parallel to each other and with the respective longitudinal axes of the emitter fingers 42, 72. The secondary trench isolation regions 72, 74 and their associated trenches extend through the base layer 16 and into the substrate 10 to the same depth as the secondary trench isolation region 22 and its associated trench 23. Respective top surfaces of the secondary trench isolation regions 22, 72, 74 project above the top surface of the base layer 16.

The collector contact region 76 is laterally located between trench isolation region 12 and secondary trench isolation region 72 inside a portion of the boundary established by the interior wall 11 of the trench isolation region 12. The secondary trench isolation region 72 is laterally located between the emitter finger 70 and the collector contact region 76. The collector contact regions 48, 76 are located at the peripheral edges of the device structure 56, and collector contact region 76 is defined in the same manner as described above with regard to collector contact region 48.

The base layer 16 is effective divided into multiple sections with each section being laterally bounded between an adjacent pair of the secondary trench isolation regions 22, 72, 74. The locations of the secondary trench isolation regions 22, 72, 74 define edges 17 of the section of the base layer 16 along which the associated trenches extends through the thickness of the base layer 16 and at which the base layer 16 terminates. The secondary trench isolation region 72 is laterally located between the base layer 16, more specifically one of the edges 17 of the base layer 16, and the collector contact region 76. The edges 17 of the base layer 16 extend lengthwise parallel with the longitudinal axes of the secondary trench isolation regions 22, 72, 74 and their trenches. At the locations of these edges 17, a portion of each of the respective secondary trench isolation regions 22, 72, 74 is coextensive with the base layer 16. For example, a portion of the secondary trench isolation region 22 is juxtaposed and coextensive with the base layer 16 at one of the edges 17 of the base layer 16, a portion of the second secondary trench isolation region 72 is juxtaposed and coextensive with the base layer 16 at another edge 17 of the base layer 16, and the emitter fingers 42, 70 are laterally located between these edges 17 of the base layer 16.

The patterned etch mask 44 (FIG. 4) is adjusted in size to extend from secondary trench isolation region 72 to secondary trench isolation region 22 such that, following the subsequent etching process, the top surfaces of the collector contact regions 48, 76 are exposed for formation of portions of the silicide layer 54 in advance of the formation of the contacts 62. The emitter fingers 42, 70 and sections of the extrinsic base layer 24 between the secondary trench isolation region 22 and the secondary trench isolation region 72, as well as underlying structural features, are protected by the size-adjusted etch mask 44 during the etching process that uncovers and exposes the top surfaces of collector contact regions 48, 76.

One or more contacts 62 are coupled with each of the collector contact regions 48, 76, and are laterally located inside the trench isolation regions 12, 13. One or more contacts 63 are coupled with a portion of the extrinsic base layer 24 operating as a base contact region between emitter fingers 42, 70, and may be located vertically above (i.e., are vertically aligned with) the secondary trench isolation region 74. One or more contacts 64 are also coupled with each of the emitter fingers 42, 70. The layout of the device structure 66 is characterized by a collector-emitter-base-emitter-collector (CEBEC) construction, and may be expanded by introducing additional sets of emitter fingers, secondary trench isolation regions, and base contact regions to furnish additional EB pairs.

In the representative embodiment, the secondary trench isolation regions 22, 74, 78 have the same construction. In an alternative embodiment, the secondary trench isolation regions 22, 74, 78 may have different constructions selected from any combination of the constructions shown in FIGS. 5-7. For example, the secondary trench isolation regions 22 and 74 may be constructed as shown in FIG. 5 and the secondary trench isolation region 78 may be constructed as shown in FIG. 6.

Figure 9:
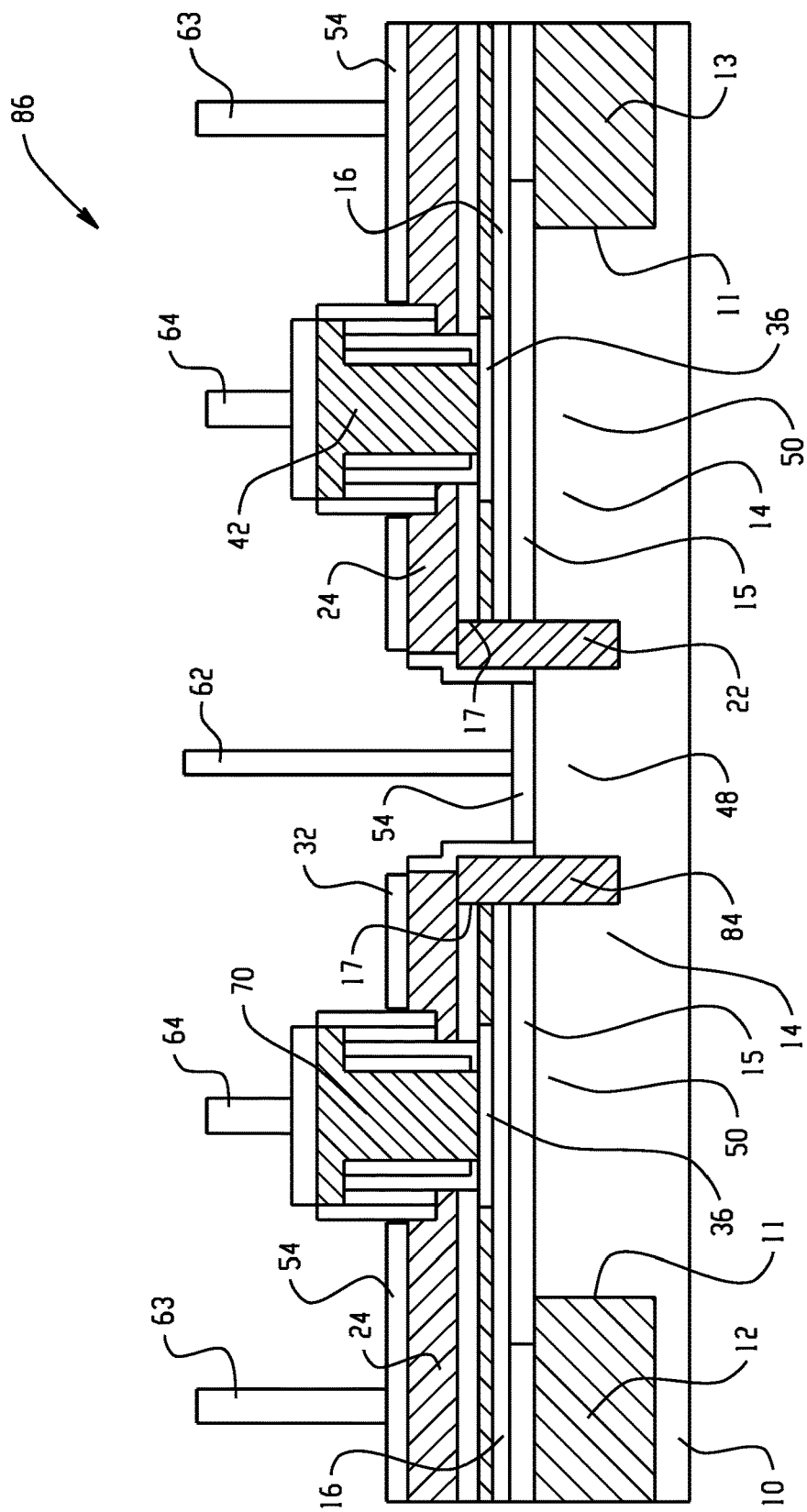

With reference to FIG. 9 in which like reference numerals refer to like features in FIG. 5 and in accordance with an alternative embodiment, a device structure 86 may be provided by modifying the device structure 56 to include the multiple emitter fingers 42, 70 that comprise the emitter, as described above. The secondary trench isolation region 22 is replicated to provide a secondary trench isolation region 84 that is spaced from the secondary trench isolation region 22. The secondary trench isolation region 84 and its associated trench extend through the base layer 16 and into the substrate 10 to the same depth as the secondary trench isolation region 22. Respective top surfaces of the secondary trench isolation regions 22, 84 project above the top surface of the base layer 16.

The collector contact region 48 is laterally located between the secondary trench isolation region 22 and the secondary trench isolation region 84. A portion of the secondary trench isolation region 22 is juxtaposed and coextensive with the base layer 16 at one of the edges 17 of the base layer 16 and a portion of the secondary trench isolation region 84 is likewise juxtaposed and coextensive with the base layer 16 at another of the edges 17 of the base layer 16. These edges 17 of the base layer 16 are laterally located between emitter finger 42 and emitter finger 70.

One or more contacts 62 are coupled with the collector contact region 48 and are laterally located inside the trench isolation regions 12, 13 such that the contacts 62 are not vertically above the trench isolation regions 12, 13. One or more contacts 63 are coupled with the extrinsic base layer 24 providing base contact regions at each peripheral edge of the active device region 14, and are located above (i.e., are vertically aligned with) the trench isolation regions 12, 13. One or more contacts 64 are also coupled with each of the emitter fingers 42, 70 of the emitter. The layout of the device structure 66 is characterized by a base-emitter-collector-emitter-base (BECEB) construction, and may be expanded by introducing additional sets of emitter fingers, secondary trench isolation regions, and collector contact regions to furnish additional EC pairs.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a substrate, the device structure comprising:
    one or more primary trench isolation regions surrounding an active device region of the substrate and a first collector contact region of the substrate, the one or more primary trench isolation regions having a top surface coplanar with a top surface of the substrate, each primary trench isolation region extending vertically to a first depth into the substrate, and the active device region comprising a collector;
    a base layer on the active device region, the base layer having a top surface;
    a base dielectric layer on the top surface of the base layer;
    a first secondary trench isolation region arranged adjacent to the base layer and extending into the substrate to a second depth that is less than the first depth, the first secondary trench isolation region laterally located between the base layer and the first collector contact region, and the first secondary trench isolation region extending through the base layer and the base dielectric layer, and a top surface of the first secondary trench isolation region projects above the top surface of the base layer;
    a semiconductor layer over the base dielectric layer, the semiconductor layer having a top surface that is coplanar with the top surface of the first secondary trench isolation region;
    an extrinsic base layer on the top surface of the semiconductor layer and the top surface of the first secondary trench isolation region; and
    an emitter in an emitter opening extending through the extrinsic base layer, the semiconductor layer, and the base dielectric layer to the base layer,
    wherein no portion of the first secondary trench isolation region is arranged vertically beneath the base layer.

2. The device structure of claim 1 wherein the first collector contact region is laterally located between the first secondary trench isolation region and one of the one or more primary trench isolation regions, and further comprising:
    a first contact coupled with the first collector contact region,
    wherein the first secondary trench isolation region is laterally located between the first contact and the emitter.

3. The device structure of claim 2 further comprising:
    a second contact coupled with the base layer,
    wherein the second contact is vertically aligned with one of the one or more primary trench isolation regions.

4. The device structure of claim 1 further comprising:
    a contact coupled by the extrinsic base layer with the base layer,
    wherein the contact is laterally arranged completely outside of a boundary established between one of the one or more primary trench isolation regions and the active device region, and the first secondary trench isolation region is laterally arranged completely inside of the boundary.

5. The device structure of claim 4 wherein the emitter is laterally located between the contact and the first secondary trench isolation region.

6. The device structure of claim 1 wherein the emitter includes a single emitter finger, and the single emitter finger is laterally located between the first secondary trench isolation region and one of the one or more primary trench isolation regions.

7. The device structure of claim 1 wherein the first secondary trench isolation region is arranged adjacent to an edge of the base layer, and the first secondary trench isolation region is laterally located between the edge of the base layer and the first collector contact region.

8. The device structure of claim 1 wherein a portion of the first secondary trench isolation region is juxtaposed with the base layer along an edge.

9. A method of making a device structure, the method comprising:
    forming one or more primary trench isolation regions that surround an active device region of a substrate and a first collector contact region of the substrate, wherein each primary trench isolation region extends vertically to a first depth into the substrate and the active device region includes a collector;
    forming a base layer on the active device region and the first collector contact region;
    forming a base dielectric layer on a top surface of the base layer;
    forming a semiconductor layer over the base dielectric layer;
    forming a trench laterally located between the active device region and the first collector contact region, wherein the trench extends vertically through the base layer, the base dielectric layer, and the semiconductor layer and into the substrate to a second depth that is less than the first depth;
    forming an electrical insulator in the trench to form a secondary trench isolation region;
    planarizing the electrical insulator such that a top surface of the secondary trench isolation region is coplanar with a top surface of the semiconductor layer;
    forming an extrinsic base layer on the top surface of the semiconductor layer and the top surface of the secondary trench isolation region;
    forming an emitter opening extending through the extrinsic base layer, the base dielectric layer, and the semiconductor layer; and
    forming an emitter in the emitter opening,
    wherein no portion of the secondary trench isolation region is arranged vertically beneath the base layer, and the secondary trench isolation region has a top surface that projects above a top surface of the base layer.

10. The method of claim 9 wherein the first collector contact region is laterally located between the secondary trench isolation region and one of the one or more primary trench isolation regions, and further comprising:

forming a first contact coupled with the first collector contact region, wherein the secondary trench isolation region is laterally located between the first contact and the emitter.

11. The method of claim 10 further comprising:

forming a second contact coupled by the extrinsic base layer with the base layer, wherein the second contact is laterally arranged completely outside of a boundary established between the one of the one or more primary trench isolation regions and the active device region, and the secondary trench isolation region is laterally arranged completely inside of the boundary.

12. The method of claim 9 further comprising:

forming a contact coupled by the extrinsic base layer with the base layer, wherein the contact is laterally arranged completely outside of a boundary established between one of the one or more primary trench isolation regions and the active device region, and the secondary trench isolation region is laterally arranged completely inside of the boundary.

* * * * *